(12) United States Patent
Edelstein et al.

(10) Patent No.: US 9,059,679 B2
(45) Date of Patent: Jun. 16, 2015

(54) TUNABLE INTERCONNECT STRUCTURES, AND INTEGRATED CIRCUIT CONTAINING THE SAME

(71) Applicant: INTERNATIONAL BUSINESS MACHINES CORPORATION, Armonk, NY (US)

(72) Inventors: Daniel C. Edelstein, White Plains, NY (US); Alberto Valdes-Garcia, Hartsdale, NY (US); Stephen M. Gates, Ossining, NY (US); Wayne H. Woods, Jr., Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 147 days.

(21) Appl. No.: 13/868,743

(22) Filed: Apr. 23, 2013

(65) Prior Publication Data
US 2014/0312986 A1    Oct. 23, 2014

(51) Int. Cl.
*H03H 7/38* (2006.01)
(52) U.S. Cl.
CPC .................................. *H03H 7/38* (2013.01)
(58) Field of Classification Search
USPC .................. 327/33–35, 156–164; 333/33–35, 333/156–164
See application file for complete search history.

(56) References Cited

U.S. PATENT DOCUMENTS

| | | | |
|---|---|---|---|
| 6,593,833 B2 | 7/2003 | Joines et al. | |
| 8,040,321 B2* | 10/2011 | Peng et al. | 345/169 |
| 2003/0001691 A1* | 1/2003 | Yung | 333/138 |
| 2009/0066447 A1* | 3/2009 | Dutta | 333/238 |
| 2009/0315633 A1* | 12/2009 | Ding et al. | 333/1 |
| 2009/0315641 A1* | 12/2009 | Ding et al. | 333/161 |
| 2011/0318861 A1* | 12/2011 | Jahnes et al. | 438/52 |
| 2012/0044194 A1* | 2/2012 | Peng et al. | 345/174 |
| 2012/0194302 A1* | 8/2012 | Ding et al. | 333/247 |

OTHER PUBLICATIONS

T. LaRocca et al., "Millimeter-Wave CMOS Digital Controlled Artificial Dielectric Transmission Lines for Reconfigurable ICs", IEEE Radio Frequency Integrated Circuits Symposium, pp. 181-184, Jun. 2008.

W. Woods et al., "Analysis and Measurement of a Novel On-Chip Variable Delay Transmission Line with Fixed Characteristic Impedance", IEEE Topical Meeting on Silicon Monolithic Integrated Circuits in RF Systems, pp. 220-223, Jan. 2010.

(Continued)

*Primary Examiner* — Brandon S Cole
(74) *Attorney, Agent, or Firm* — Louis J. Percello; Roberts Mlotkowski Safran & Cole, P.C.

(57) ABSTRACT

Tunable interconnect structures, integrated circuits containing the tunable interconnect structures and methods of manufacturing the same are disclosed. The interconnect transmission line structure includes a signal conductor and a plurality of conductors in proximity to the signal conductor. The structure further includes one or more switchable conductors in proximity to at least the signal conductor. The one or more switchable conductors has a programmable wiring switch with a terminal connected to the one or more switchable conductors and another terminal connected to ground.

20 Claims, 4 Drawing Sheets

(56) References Cited

OTHER PUBLICATIONS

S. Shlafman et al., "Variable Transmission Lines, Structure and Compact Modeling", IEEE Conference on Microwaves, Communications, Antennas and Electronic Systems, pp. 1-4, Nov. 2011.

C.-Y. Wen et al., "A Phase-change via-Reconfigurable On-Chip Inductor", IEEE IEDM 2010, pp. 237-240.

M. Duran-Sindreu et al., "Electrically Tunable Composite Right/Left Handed Transmission-Line based on Open Resonators and Barium-Stronium-Titanate Thick Films", Microwave Engineering, TU Darmstadt, 64283 Germany, 2011 IEEE, 4 pages.

D.C. DeGroot et al., "Microwave Properties of Voltage-Tunable $YBa_2Cu_3O_{7-\delta}$ / $SrTiO_3$ Coplanar Waveguide Transmission Lines", IEEE Transactions on Applied Superconductivity, vol. 5, No. 2, Jun. 1995, 4 pages.

Y-H Chun et al., "BST-Varactor Tunable Dual-Mode Filter Using Variable Zc Transmission Line", IEEE Microwave and Wireless Components Letter, vol. 18, No. 3, Mar. 2008, 3 pages.

S. Williams, "Finding the Missing Memristor", HP, Copyright 2010, 63 pages.

* cited by examiner

TUNABLE INTERCONNECT STRUCTURES, AND INTEGRATED CIRCUIT CONTAINING THE SAME

FIELD OF THE INVENTION

The invention relates to integrated circuits and, more particularly, to tunable interconnect structures, integrated circuits containing the tunable interconnect structures and methods of manufacturing the same.

BACKGROUND

Transmission line interconnect structures are employed in multiple IC applications. However, their characteristics (delay and characteristic impedance) are fixed once they are fabricated. In many situations, to modify the characteristics of such interconnects it is desirable to make the IC reconfigurable, to compensate for process variations, or to make fine adjustments and improve performance.

A problem with the present solutions is that the configurability depends on FET switches fabricated in the front end of the line (FEOL) or other conventional FEOL switches or devices such as BJTs, HBTs, diodes, etc. The parasitics associated with such switches and devices (including vias to descend to the FEOL) are difficult to model, they decrease tunability and increase loss.

SUMMARY

In a first aspect of the invention, an interconnect transmission line structure comprises a signal conductor and a plurality of conductors in proximity to the signal conductor. The structure further comprises one or more switchable conductors in proximity to at least the signal conductor. The one or more switchable conductors has a programmable wiring switch with a terminal connected to the one or more switchable conductors and another terminal connected to ground.

In another aspect of the invention, an interconnect transmission line structure comprises a signal conductor and a plurality of ground line conductors in proximity to the signal conductor. The structure further comprises at least one switchable capacitance plate in proximity to the plurality of ground line conductors. The structure further comprises a switchable inductance return line electrically coupled to the plurality of ground line conductors. The structure further comprises a first programmable wiring switch electrically coupled between the at least one switchable capacitance plate and ground or other voltage reference. The structure further comprises a second programmable wiring switch electrically coupled between the switchable inductance return line and ground or other voltage reference.

In another aspect of the invention, a method for adjusting delay of an interconnect structure comprises selecting one or more switchable conductors from a plurality of switchable conductors, and applying a programming electrical pulse to a programmable switch device that is electrically coupled between the selected one or more switchable conductors and ground or a voltage reference, in order to switch the selected one or more switchable conductors between an ON state and an OFF state.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a tunable BEOL interconnect structures, and integrated circuit containing the same, which comprises the structures of the present invention. In still further embodiments, a method in a computer-aided design system is provided for generating a functional design model of a tunable BEOL interconnect structures. The method comprises generating a functional representation of the structural elements of the tunable BEOL interconnect structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
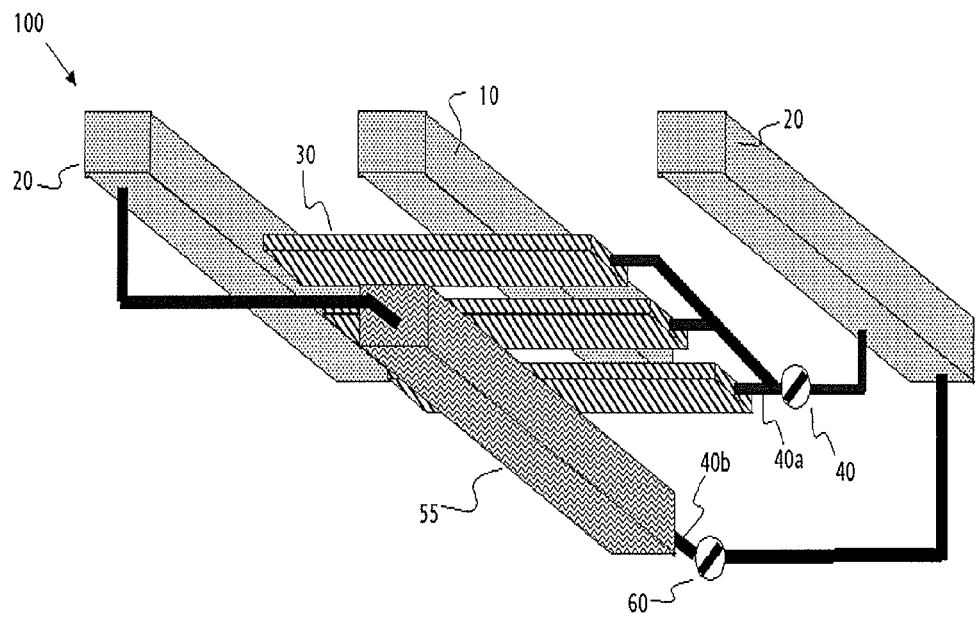
FIG. 1 shows a tunable transmission line in accordance with aspects of the present invention.

The invention relates to integrated circuits and, more particularly, to tunable interconnect structures, integrated circuits containing the tunable interconnect structures and methods of manufacturing the same. In more specific embodiments, the present invention provides back end of the line (BEOL) radio frequency (RF) transmission line (t-line) structures and methods of manufacture, which include tuning of their delay without the involvement of front end of the line (FEOL) components, e.g., FET switches or other conventional FEOL switches or devices such as BJTs, HBTs, diodes, etc. Advantageously, in embodiments, the tunable t-lines of the present invention provide the ability to adjust the characteristics of a transmission line, and compensate for variations in (i) processing conditions or (ii) in active components. In embodiments, the compensation can be provided dynamically by changing delay and impedance of the t-line by switching between different states using, for example, a nonvolatile switch in BEOL. In this way, the tunability of the t-lines enables re-matching/optimization of the design with minimal cost and enables the designer to take advantage of the full capabilities of the technology. Also, dynamic fine-control t-line delay adjustment has been found to be useful, for example, in microprocessor clock tree branches to reduce jitter and latency variability across a large, high-performance chip.

In embodiments, the structures of the present invention use a BEOL programmable "wiring switch" to control passive device elements coupled to the transmission lines, and in close proximity or forming a part thereof. The BEOL switch is located in the BEOL wiring levels for high-Q/low parasitics, rather than in the FEOL. The BEOL switch, in turn, can be controlled by FEOL devices or circuits, but now the FEOL parasitics are decoupled from the performance of the tunable t-line structure. Also, by using the wiring switch of the present invention, it is now possible to use an inherently non-volatile device, to short a segment to ground or leave it floating (e.g., isolated from ground). The segment may be, for example, a signal line, a ground plate, a capacitor region, a varactor region, or an inductor region. The non-volatile aspect of the present invention enables a tuned state of the transmission line or tuning stub to be retained when the circuit is powered off.

In embodiments, the invention provides an integrated circuit in which one or more of the t-line interconnects can be tuned to achieve certain delay specifications. In further embodiments, a resonantly adjusted tuning stub is provided. In still further embodiments, a clock tree with tunable delay time is provided. In still further embodiments, a tunable on-chip or off-chip antenna is provided. The antenna may be tuned by, for example, (i) adjusting the physical length of the antenna by adding or subtracting antenna segments using the wiring switch of the present invention, e.g., turn on and off various segments using the wiring switch, or (ii) capacitively tuning the antenna by switching on or off different capacitor elements located next to the antenna.

Figure 5:
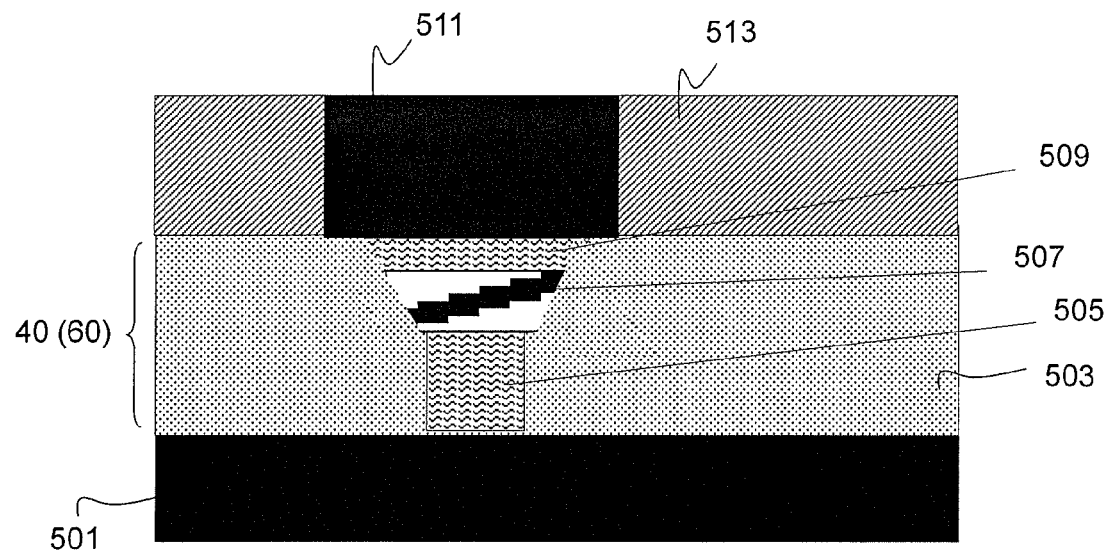
FIG. 5 shows a cross section view of an example wiring switch, in accordance with aspects of the present invention.

FIGS. 1 and 5 show a wiring switch in accordance with aspects of the present invention. It should be understood by those of skill in the art that the wiring switch and other passive and active components of the present invention can be manufactured in a number of ways using a number of different tools. In general, though, the methodologies and tools used to form the structures of the present invention can be adopted from integrated circuit (IC) technology. For example, the structures of the present invention, e.g., switch, plates, ground lines, inductance lines, etc., are built on wafers and are realized in films of materials patterned by photolithographic processes. In particular, the fabrication of structures uses three basic building blocks: (i) deposition of films of material on a substrate, (ii) applying a patterned mask on top of the films by photolithographic imaging, and (iii) etching the films selectively to the mask.

More specifically, in FIG. 1, a tunable t-line segment using a wiring switch in accordance with aspects of the present invention is generally depicted as reference numeral 100. In embodiments, the tunable t-line segment 100 includes a signal line (signal conductor) 10 and a plurality of ground lines (ground conductors) 20. In embodiments, the signal line 10 can be a central signal line, and the ground lines 20 can be representative of non-switchable conductors, e.g., ground lines or meshes or other signal lines, etc.

In embodiments, the signal line 10 and plurality of ground lines 20 can be fabricated from any metal or metal alloy material, formed in an upper dielectric layer using conventional lithographic, etching and deposition processes commonly employed in CMOS fabrication (e.g., using an additive or subtractive metal process). In embodiments, the metal or metal alloy can be deposited using conventional deposition processes such as, for example, atomic layer deposition (ALD), metal sputtering, or a chemical vapor deposition (CVD), amongst other deposition methods. The metal or metal alloy can be any known metal or metal alloy, suitable for its particular purpose, e.g., copper damascene structures. In embodiments, the dielectric layers of the present invention can be, for example, $SiO_2$, deposited prior to or after the deposition of the metal or metal alloy.

By way of example, a resist can be placed over an insulating layer and exposed to light to form patterns, corresponding with the shapes of the signal line 10 and the ground lines 20. The exposed regions of the insulating layer are then etched to form trenches using conventional processes such as, for example, reactive ion etching. A metal or metal alloy layer is then deposited in the trenches to form the signal line 10 and the ground lines 20. The metal or metal alloy can then undergo a chemical mechanical polishing (CMP) process. In embodiments, the signal line 10 and the ground lines 20 can be formed in the same processing steps, in a same plane.

In embodiments, the signal line 10 and the ground lines 20 can have uniform width and lengths; although many different configurations are contemplated by the present invention. For example, the signal line 10 and the ground lines 20 can have a varied thickness or different lengths, etc. Inductance and capacitance of the t-line segment 10 can be tuned by varying the widths, spacing between the signal line 10 and the ground lines 20, as well as the thickness. In embodiments, the signal 10 and ground lines 20 have widths of 6 μm and depths of 1.2 μm and are made of Cu. In other embodiments, the width, depth and length of the Cu segments may be different.

Capacitance plates 30 are formed under the signal line 10 and the ground lines 20, preferably in a perpendicular orientation thereto. In embodiments, the capacitance plates 30 are in the Cu wire layer below the signal and ground lines, and may have a thickness of about 1.2 μm with widths of 5 μm; although other dimensions are also contemplated by the present invention. Similar to the fabrication processes of the signal line 10 and the ground lines 20, the capacitor plates 30 may be formed using any metal or metal alloy material, formed in an dielectric layer using conventional lithographic, etching and deposition processes commonly employed in CMOS fabrication (e.g., using an additive or subtractive metal process). In embodiments, the metal or metal alloy can be deposited using conventional deposition processes such as, for example, atomic layer deposition (ALD), metal sputtering, or a chemical vapor deposition (CVD), amongst other deposition methods. The metal or metal alloy can be, e.g., copper damascene structures. In embodiments, the dielectric layer can be, for example, $SiO_2$, deposited prior to the deposition of the metal or metal alloy.

In embodiments, the capacitance plates 30 are electrically coupled to a capacitance switch 40 formed within dielectric layers. In this way, the capacitance plates 30 are switchable conductors. The capacitance switch 40 is, in turn, electrically coupled to a ground line 20. In embodiments, the capacitance switch 40 is a non-volatile switch electrically coupled to the capacitance plates 30 and ground line 20 by wires 40a, formed using conventional wiring structures and fabrication methods as described herein. It should be understood by those of skill in the art that the capacitance switch 40 can be electrically coupled to individual capacitance plates 30 or any combination of capacitance plates 30. As such, although a single capacitance switch 40 is shown in FIG. 1, it should be understood that more than one capacitance switch 40 can also be provided, e.g., one electrically coupled to each capacitance plate 30 or any combination thereof.

In embodiments, the capacitance switch 40 is formed in a via as described below in reference to FIG. 5. The capacitance switch 40 allows capacitance tuning between a "closed" (e.g., "short") state and an "open" state by applying a current thereto, e.g., changing a resistance of the switch. As should be understood by those of skill in the art, the closed state is a "high" capacitance state; whereas, the open state is a "low"

capacitance state. By way of example, in the high capacitance state, it is now possible to tune the structure to work in the range of about above 70 GHz, without the disadvantages of a tunable FET switch. In fact, by implementing the capacitance switch 40 of the present invention, there is no frequency limitation as in a tunable FET switch.

The capacitance switch 40, in embodiments is programmable by applying an electrical current. As described with regard to FIG. 4b and TABLES 1 and 2 below, the resistance of the switch can be changed to provide an ON state and an OFF state.

An inductance return line 55 is formed under the capacitance plates 30 and electrically coupled between ground lines 20. The inductance return line 55 is electrically coupled to one of the ground lines 20, through an inductance switch 60. In this way, the inductance return line 55 is a switchable conductor. Similar to the capacitance switch 40, the inductance switch 60 is fabricated as described in detail below and is programmable by applying an electrical current. The inductance return line 55 thus also includes a non-volatile switch 60.

In embodiments, the inductance switch 60 can be formed in vias of varying diameters, depending on the desired inductance, using conventional CMOS technologies as already described herein. As an illustrative example, the inductance switch 60 can be formed in a via of diameters of 50 nm to 200 nm. As described with regard to FIG. 4b and TABLES 1 and 2 below, the resistance of the switch can be changed to provide an ON state and an OFF state.

Figures 2A, 2B:
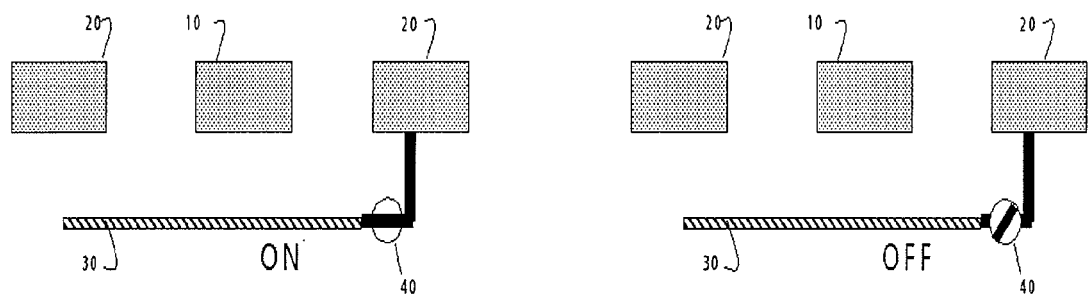
FIGS. 2*a* and 2*b* represent a highly schematic representation of switched states of a capacitance switch in accordance with aspects of the present invention.

FIGS. 2a and 2b represent a highly schematic representation of the switched states of the capacitance switch 40. In particular, FIG. 2a shows the capacitance switch 40 in an ON state and FIG. 2b shows the capacitance switch 40 in an OFF state. In the OFF state, the segment (e.g., portion of the capacitance plate) will float (will be electrically isolated from ground or other components). The switch 40 can be switched between the ON state and the OFF state by application of a programmable electrical current. As in any of the embodiments, the capacitance switch 40 (and/or inductance switch 60) can have an on state resistance of any value, e.g., between 1 ohm and 1000 ohms.

Figure 3:
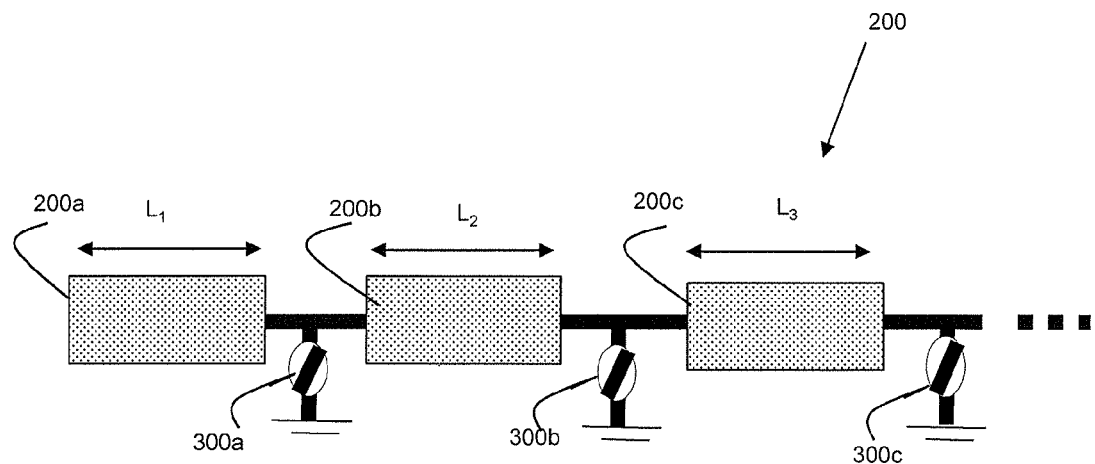
FIG. 3 shows a variable tuning stub using wiring switches in accordance with aspects of the present invention.

FIG. 3 shows a variable tuning stub using wiring switches in accordance with aspects of the present invention. The variable tuning stub 200 may be representative of an antenna that can be tuned by, for example, (i) adjusting the physical length of the antenna, e.g., adding or subtracting segments using the switch of the present invention, or (ii) capacitively tuning the antenna by switching on or off different capacitor elements located next to the antenna.

More specifically, the variable tuning stub 200 includes a plurality of segmented transmission lines 200a, 200b, 200c of respective lengths, $L_1$, $L_2$, and $L_3$. In embodiments, the lengths $L_1$, $L_2$, and $L_3$ may be the same or of different lengths, or any combination thereof. Although three segmented transmission lines are shown, one of skill in the art would understand that more or less than three segmented lines are contemplated by the present invention, e.g., N=2 to 10. In embodiments, the segmented lines 200a, 200b, 200c can be fabricated using conventional CMOS fabrication technologies as described herein such that no further discussion is required to understand the invention. The segmented transmission line 200a, 200b, 200c can be composed of any metal or metal alloy such as, for example, copper, tungsten, etc., and can be representative of a signal line or capacitance plates.

Non-volatile switches 300a, 300b, 300c are provided between each respective segmented transmission lines 200a, 200b, 200c (or any combination thereof), using the programmable material as described herein. In embodiments, the non-volatile switches 300a, 300b, 300c can be powered up or powered down, e.g., ON state or OFF state, to adjust the length of the transmission line, e.g., in the ON state, the non-volatile switches 300a, 300b, 300c would electrically couple adjacent transmission lines to effectively create a longer transmission line. In this way, for example, a signal line can be tuned to a ¼λ wavelength or ½λ wavelength signal line.

Figures 4A, 4B:
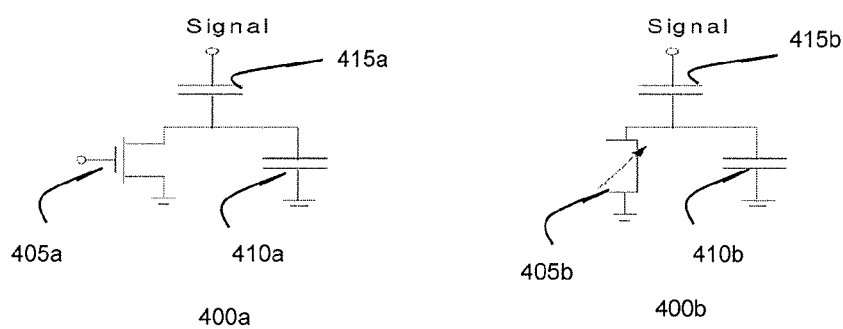
FIGS. 4*a* and 4*b* show a comparison of a conventional FEOL structure and representative circuit diagram of a structure implementing aspects of the present invention.

FIGS. 4a and 4b show a comparison of a conventional FEOL structure and representative circuit diagram of a structure implementing aspects of the present invention. Specifically, FIG. 4a shows a representative circuit diagram 400a of a conventional FEOL structure having a FET 405 in parallel with a BEOL structure, e.g., capacitance structure 410a. The FET 405 and structure 410a are electrically coupled to a signal line, e.g., signal line through a capacitance structure 415. The FET 405 can be opened or closed, by applying control voltage thereto. However, the FET will have limited frequency ranges and have parasitics that decrease tunability and increase loss.

In comparison, the representative circuit diagram 400b shown in FIG. 4b includes a programmable switch 405b, in parallel with a BEOL structure, e.g., capacitance structure 410b. The programmable switch 405b and structure 410b are electrically coupled to a signal line, e.g., signal line through a capacitance structure 415b. The programmable switch 405b can be opened or closed by applying current thereto, e.g., increasing or decreasing the resistance of the programmable material. In the closed state (e.g., ON state), the programmable switch 405b is shorted. In the configuration of the representative circuit diagram 400b, it is possible to tune the structure to work in the 70 to 80 GHz range or higher, without the disadvantages of a FET switch.

FIG. 5 shows, in cross section, an example construction of the wiring switch, e.g., switch 40 or 60 of FIG. 1 (or switches 300a, 300b, 300c of FIG. 3). In embodiments, each switch can be located between a lower Cu wire 501 and an upper Cu wire 511. The upper wire 511 is shown in cross section and is inlaid within a dielectric 513, for example. The switch is located in a via type structure within a dielectric 503, and optionally there are multiple layers within the dielectric 503 to facilitate construction. An electrode 505 is formed on the top of the lower Cu wire 501 that also functions as both a contact and a diffusion barrier. The electrode 505 prevents direct contact and mixing of the copper line 501 with the programmable material 507.

Common electrode materials can be, for example, titanium nitride (TiN), tantalum nitride (TaN), and the noble metals of, e.g., platinum (Pt) and palladium (Pd). In embodiments, electrode 505 may be any combination of hafnium (Hf), vanadium (V), iridium (Ir), platinum (Pt), tungsten (W), palladium (Pd), iridium oxide (IrOx), titanium nitride (TiN), tantalum nitride (TaN), titanium aluminum nitride (TiAlN), tungsten nitride (WN), ruthenium (Ru), and ruthenium oxide (RuOx). The nitride electrode such as TiN, TaN, WN, may be non-stoichiometric, so that, for example, TixNy describes the composition, and y and x can be less than or greater than 1.0.

A layer of programmable material 507 is formed on the lower electrode 505. In embodiments, the programmable material 507 may be a phase change material (PCM), or this material 507 may be a layer of a metal oxide, with hafnium oxide (HfOx), or tantalum oxide (TaOx), being preferred examples. In embodiments, the programmable material may be, for example, nickel oxide (NiOx), TiOx, WOx, AlOx, SrTiOx, ZrOx, ZnOx), HfOx, or TaOx, or any combination of these metal oxides. The metal oxide 507 may be formed by using a chemical vapor deposition (CVD) method, a physical vapor deposition (PVD) method, or an atomic layer deposition (ALD) method, as is well known in the art.

Within the general structure of FIG. 5, two different types of switches are disclosed. In a first switch type, a metal oxide is used as the material 507, and the mechanism of switching resistance comprises forming and breaking a filament like conduction path in the oxide, using voltage pulses of the order of 1 to 5 Volts, preferably 1.5 to 2 Volts, and using opposite polarity to form and break the conduction path. This type requires control circuits with both + and − voltage pulses.

In a second switch type, a phase change material is used as material 507, which provides a different mechanism. For example, using a PCM material 507, the switching of resistance comprises moving between a crystalline state with low resistance and an amorphous state with high resistance. This is done using control voltage pulses of 1 polarity to heat the PCM, and the correct turn off shape (fast or slow trailing edge) to cool the PCM into the low or high resistance state. Optionally, the via sidewalls are tapered as shown in FIG. 5 to allow for deposition of the programmable material 507 into the via. As an illustrative example, the switch 40 or 60 can be formed in a via of diameters of 50 nm to 1000 nm.

Still referring to FIG. 5, an electrode 509 is formed on top of the programmable material 507, that also functions as a diffusion barrier thus preventing direct contact and mixing of the copper line 511 with the programmable material 507. The electrode 509 may be formed of the same materials described above for the lower electrode 505. In embodiments, the programmable material generally has a thickness from 1 to 50 nm, which is smaller than the via height. Thus, the electrodes 505 and 509 can occupy a large fraction of the via while the programmable material occupies a small fraction of the via.

In embodiments, the programmable material may be a phase change material (PCM), with examples being GeTe, GeSe, $Ge_{15}Sb_{85}$, $Sb_2Te$, $Ge_xSb_yTe_z$ with x, y and z showing the percent composition of the three elements, so x+y+z=100. In further embodiments, the ratio of the elements may be different from those examples so that any combination of the elements Ge, Sb, Te, Se, In or Ag is contemplated by the present invention. In further embodiments, elements such as Si, Al, N, O or C may be added to make the material more like a glass and modify the properties of the PCM.

Examples of the PCM type switch are now described. For example, TABLE 1 below shows the on state resistance of either the capacitance switch 40 or inductance switch 60 using dimensions typical for advanced CMOS processing. The table shows materials with a resistivity (ρ) of 0.0006 Ω-cm, e.g., $G_{e15}S_{b85}$ and $S_{b2}Te$.

As shown in the TABLE 1, resistance of the capacitance switch 40 or inductance switch 60 significantly decreases as via diameter increases. Estimates of the current required to switch the device are shown. The lower limit current to switch the capacitance switch 40 or inductance switch 60 increases as the resistance decreases (as the diameter of the via increases, and hence the volume of the PCM increases). In this way, it is possible to tune the device by applying a different current to the switch, e.g., capacitance switch 40 and inductance switch 60. More specifically, by implementing the switches of the present invention, e.g., capacitance switch 40 and inductance switch 60, it is now possible to program a resonance tuned t-line interconnect structure by applying different currents.

TABLE 1

| Via diameter (nm) | Thickness (nm) (perpendicular to via cross section) | Switch on-state resistance (Ω) | Switching current lower limit (mA) | Switching current upper limit (mA) |
|---|---|---|---|---|
| 56 | 25 | 61.0 | 0.5 | 2.5 |
| 112 | 25 | 15.0 | 2.0 | 10 |
| 130 | 25 | 11.0 | 3.0 | 13 |
| 200 | 25 | 5.0 | 8.0 | 32 |

TABLE 2 below shows additional device descriptive examples and on-state resistance in ohms, using the capacitance switch 40 and/or inductance switch 60 of the present invention. As shown in TABLE 2, different resistance targets are achievable, e.g., tunable, by using different materials, with different diameters and/or different applied currents.

TABLE 2

| Device Description | Via diameter (nm) | Device on-state resistance (Ω) |
|---|---|---|
| Phase Change Material (PCM) with resistivity (ρ) less than 0.001 Ω-cm. | 100 | 15 |
| PCM with ρ < 0.001 Ω-cm. | 200 | 5 |
| PCM, programming of 0.4 mA | 110 | 1000 |
| PCM, programming of 4 mA | 110 | 100 |
| PCM, programming of 20 mA | 110 | 20 |

As shown in TABLE 2, above, as the diameter of the via increases, the on-state resistance will decrease. Also, comparing a constant diameter via, as the current increases, the on-state resistance will decrease. In this way, it is possible to tune the device by applying a different current to the switches, e.g., capacitance switch 40 and inductance switch 60. More specifically, by implementing the switches of the present invention, e.g., capacitance switch 40 and inductance switch 60, it is now possible to program a resonance tuned t-line interconnect structure.

Figure 6:
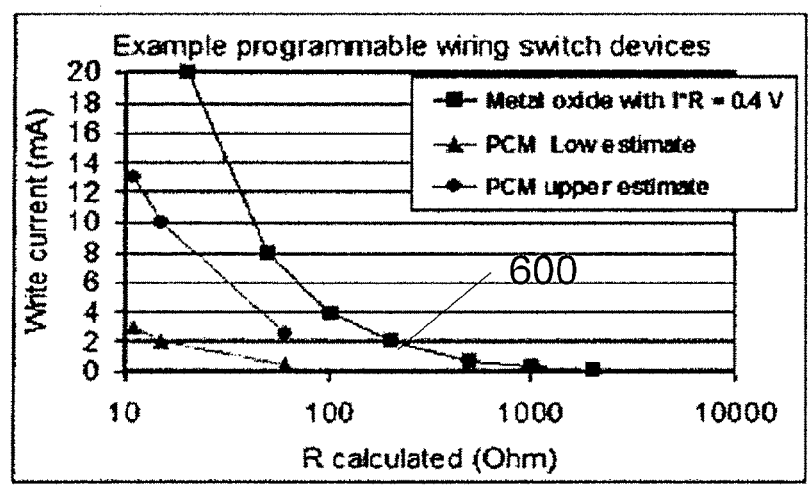
FIG. 6 shows a graph of programming (or write) current vs. resistance of a programmable switch with phase change material in accordance with aspects of the present invention.

FIG. 6 shows a graph of programming (or write) current vs. resistance of a programmable switch with phase change material. In embodiments, the programmable material shown as material 507 in FIG. 5 is a metal oxide and is represented by line 600. In this case, line 600 of FIG. 6 describes an empirical equation I*R=0.4V, where I is the programming or write current, R the device resistance and V the programming voltage. This equation allows the "on" resistance to be adjusted by the programming current used. In comparison to the other lines in FIG. 6, the metal oxide represented by line 600 shows a higher resistance at lower currents and a lower resistance at higher currents. It should be understood that these values and materials shown in FIG. 6 are merely illustrative, and that different values will result from use of different materials.

As should be understood by those of skill in the art, a method of tuning a structure is provided by implementing the switching technology of the present invention. That is, a method for adjusting the delay of an interconnect structure comprises, for example, providing a central signal conductor and a plurality of switchable conductors adjacent to the central signal conductor. The switchable conductors have a switch device connecting to ground, for example. The method further comprises selecting one or more switching devices from a group of any combination of the switchable conductors, and applying a programming electrical pulse to the switch devices of the group in order to adjust the resistance (e.g., increase or decrease the resistance) of each switch, thus effectively opening or closing the switches to tune the interconnect structure. The programming electrical pulse for the metal oxide device, uses voltage pulses of the order of 1 to 5 Volts, preferably 1.5 to 2 Volts. Pulses of opposite polarity are used to form and break the conduction path. This switch type requires control circuits with both + and − voltage pulses. Programming for a PCM switch is different, using control voltage pulses of 1 polarity to heat the PCM and the correct turn off shape (fast or slow trailing edge) to cool the PCM into the low or high resistance state.

Figure 7:
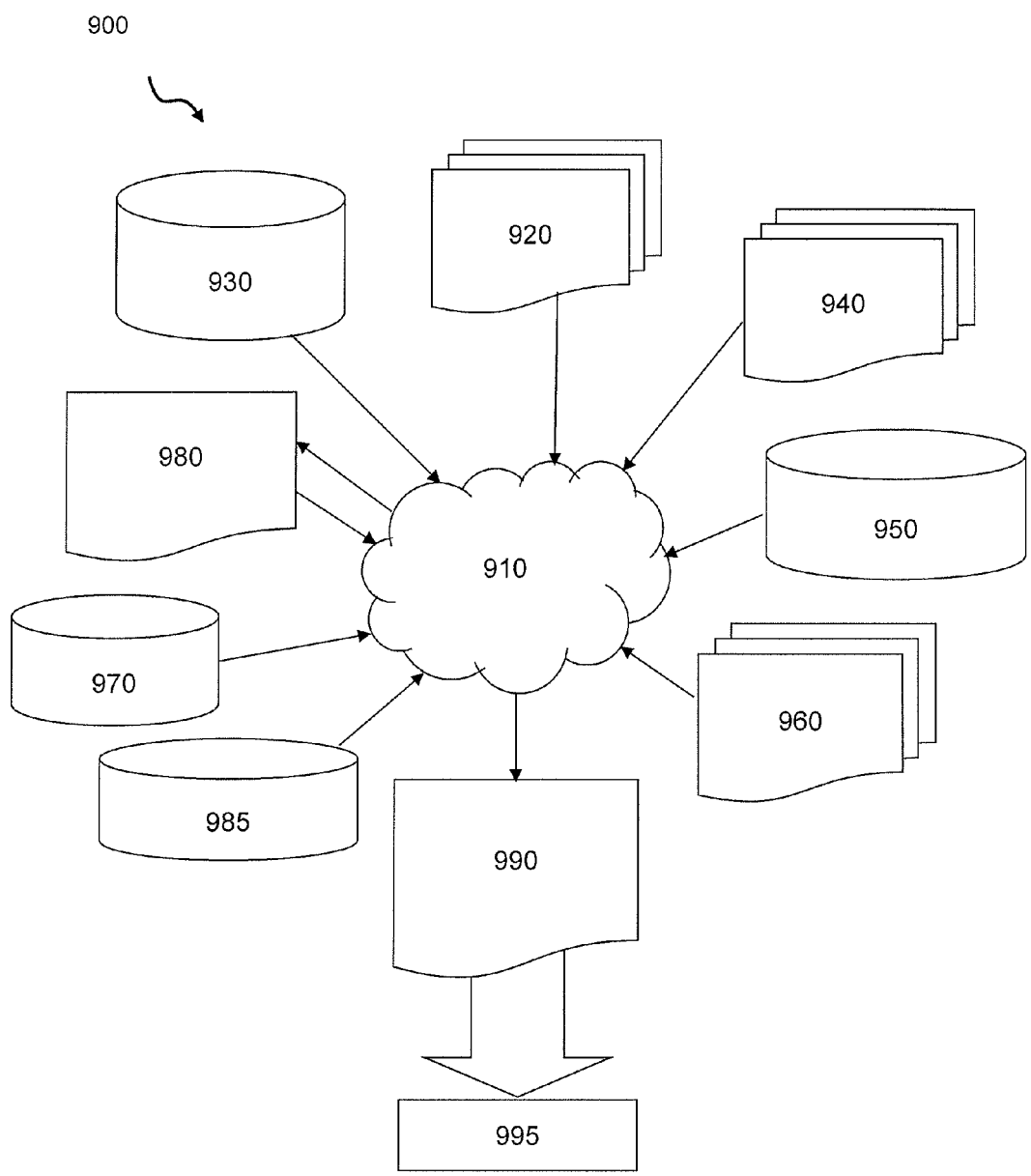
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 3, 4b and 5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures in any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 3, 4b and 5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 3, 4b and 5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3, 4b and 5. In one embodiment, design structure 990 may comprise a compiled, executable HDL simulation model that functionally simulates the devices shown in FIGS. 1, 2a, 2b, 3, 4b and 5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3, 4b and 5. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An interconnect transmission line structure comprising:
a signal conductor;
a plurality of conductors in a same plane as the signal conductor; and
one or more switchable conductors only perpendicular to the plane formed by the signal conductor and the plurality of conductors, the one or more switchable conductors having a programmable wiring switch with a terminal connected to the one or more switchable conductors and another terminal connected to ground.

2. The interconnect transmission line structure of claim 1, wherein the plurality of conductors are at least one of ground lines or meshes and other signal lines.

3. The interconnect transmission line structure of claim 1, wherein the plurality of conductors are non-switchable conductors.

4. The interconnect transmission line structure of claim 1, wherein the programmable wiring switch has an on-state resistance of 1-10,000 ohms.

5. The interconnect transmission line structure of claim 4, wherein the programmable wiring switch has an on-state resistance of 1-1,000 ohms.

6. The interconnect transmission line structure of claim 1, wherein the programmable wiring switch is a phase change material provided within a via.

7. The interconnect transmission line structure of claim 6, wherein the phase change material is selected from GeTe, GeSe, $Ge_{15}Sb_{85}$, $Sb_2Te$, $Ge_xSb_yTe_z$ with x, y and z showing a percent composition such that x+y+z=100%.

8. The interconnect transmission line structure of claim 6:
wherein the phase change material is selected from any combination of the elements Ge, Sb, Te, Se, In, Ag elements Si, Al, N, O or C added;
wherein the programmable wiring switch further comprises:
a first electrode above a lower wire, where the first electrode acts as a contact and a diffusion barrier between the lower copper wire and the phase change material;
the phase change material is above the first electrode and below a second electrode; and
the second electrode is above below a copper line, where the second electrode acts as a diffusion barrier between the phase change material and the copper line.

9. The interconnect transmission line structure of claim 1, wherein the programmable wiring switch is a metal oxide material provided within a via.

10. The interconnect transmission line structure of claim 9, wherein the metal oxide is selected from HfOx, TaOx, NiOx, TiOx, WOx, AlOx, SrTiOx, ZrOx, ZnOx, or any combinations thereof.

11. The interconnect transmission line structure of claim 1, wherein the one or more switchable conductors is at least one of an inductance return line and capacitance plates.

12. The interconnect transmission line structure of claim 1, wherein the one or more switchable conductors have each one terminal at a given point along the signal conductor and another terminal connected to the ground.

13. The interconnect transmission line structure of claim 1, wherein the one or more switchable conductors are connected to a single programmable wiring switch.

14. The interconnect transmission line structure of claim 1, wherein the one or more switchable conductors are each connected to a single programmable wiring switch and wherein the single programmable wiring switch allows operation of the interconnect transmission line structure at frequencies above 70 Gigahertz.

15. An interconnect transmission line structure comprising:
a signal conductor;
a plurality of ground line conductors in a same plane as the signal conductor;

at least one switchable capacitance plate perpendicular to the plane formed by the signal conductor and the plurality of ground line conductors;

a switchable inductance return line perpendicular to the plane formed by the signal conductor and the plurality of ground line conductors and electrically coupled to the plurality of ground line conductors;

a first programmable wiring switch electrically coupled between the at least one switchable capacitance plate and ground or other voltage reference; and a second programmable wiring switch electrically coupled between the switchable inductance return line and ground or other voltage reference.

16. The interconnect transmission line structure of claim 15, wherein the first and second programmable wiring switch is a phase change material or a metal oxide provided within a via.

17. The interconnect transmission line structure of claim 15, wherein at least one of the switchable inductance return line and the at least one switchable capacitance plate are segmented and the respective first and second programmable wiring switch are provided between each segment.

18. The interconnect transmission line structure of claim 15, wherein the at least one switchable capacitance plate is plural capacitance plates and the first programmable wiring switch is connected to each of the plural capacitance plates.

19. The interconnect transmission line structure of claim 15, wherein the at least one switchable capacitance plate is plural capacitance plates and the first programmable wiring switch is plural switches each of which are individually connected to a respective one of the plural capacitance plates; and wherein the signal conductor of the interconnect transmission line structure is tuned by applying different currents to the plurality of capacitance plates and the switchable inductance return line.

20. A method for adjusting delay of an interconnect structure, comprising:

selecting a one or more switchable conductors from a plurality of switchable conductors; and applying a programming electrical pulse to a programmable switch device of phase change material that is electrically coupled between the selected one or more switchable conductors and ground or a voltage reference, in order to change resistance and switch the selected one or more switchable conductors between an ON state and an OFF state.

* * * * *